United States Patent
Tamaki (10) Patent No.: US 6,664,178 B2
(45) Date of Patent: Dec. 16, 2003

(54) METHOD OF FORMING BURIED INTERCONNECTING WIRE

(75) Inventor: Tokuhiko Tamaki, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 1 day.

(21) Appl. No.: 09/824,203

(22) Filed: Apr. 3, 2001

(65) Prior Publication Data

US 2001/0029667 A1 Oct. 18, 2001

Related U.S. Application Data

(63) Continuation of application No. 08/745,343, filed on Nov. 8, 1996, now Pat. No. 6,260,266.

(30) Foreign Application Priority Data

Nov. 10, 1995 (JP) ............................................. 7-292974

(51) Int. Cl.[7] .......................................... H08L 21/4763
(52) U.S. Cl. ....................... 438/627; 438/633; 438/634; 438/643; 438/648; 438/687
(58) Field of Search ................................ 438/618, 622, 438/5, 627–9, 631, 4, 687, 628, 625, 629, 634, 642, 643, 644, 645, 646, 648, 909; 427/96, 7, 9, 123.1, 248.1, 250

(56) References Cited

U.S. PATENT DOCUMENTS

| | | | |
|---|---|---|---|
| 4,230,553 A | 10/1980 | Bartlett et al. | 204/192.36 |
| 4,277,321 A | 7/1981 | Bartlett et al. | 204/192.36 |
| 4,762,728 A | 8/1988 | Keyser et al. | 438/437 |
| 4,897,709 A * | 1/1990 | Yokoyama et al. | 257/301 |
| 5,363,550 A | 11/1994 | Aitken et al. | 29/828 |
| 5,484,494 A | 1/1996 | Oda et al. | 148/561 |
| 5,593,511 A | 1/1997 | Foster et al. | 148/238 |
| 5,599,739 A | 2/1997 | Merchant et al. | 438/628 |
| 5,656,542 A | 8/1997 | Miyata et al. | 438/645 |
| 5,663,102 A | 9/1997 | Park | 438/626 |
| 5,712,193 A * | 1/1998 | Hower et al. | 438/643 |
| 6,025,243 A | 2/2000 | Ohmi et al. | 438/347 |

FOREIGN PATENT DOCUMENTS

| | | | | |
|---|---|---|---|---|
| JP | 401005015 A | * | 1/1989 | ......... H01L/21/285 |
| JP | 2-240920 | | 9/1990 | |
| JP | 3-132022 | | 6/1991 | |
| JP | 6-275623 | | 9/1994 | |
| JP | 07135186 A | * | 5/1995 | ........... H01L/21/28 |

OTHER PUBLICATIONS

Deposition Technologies for Films and Coatings, Copyright @1982, Noyes Publications.

"Diffusion Barrier Properties of Transition Metals and Their Nitrides for Cu Interconnections", by Nakano et al., Proc. of 1994 VMIC Conference, Catalog No. 94ISMIC–103 (Jun. 7–8, 1994), pp. 407–413.

* cited by examiner

Primary Examiner—George Fourson
Assistant Examiner—Julio J. Maldonado
(74) Attorney, Agent, or Firm—McDermott, Will & Emery (57) ABSTRACT

A silicon substrate on which a silicon dioxide film having a groove is formed is placed on a sample stage disposed in a vacuum chamber. Subsequently, a titanium film and a tungsten film are deposited sequentially on the silicon dioxide film. The surface of the tungsten film is nitrided by using a plasma under the pressure maintained at 10 Pa or higher inside the vacuum chamber, so as to form a tungsten nitride film. After a copper film is deposited on the tungsten nitride film, the portions of the titanium film, tungsten film, tungsten nitride film, and copper film located outside the groove are removed, thus forming a buried interconnecting wire made of copper.

14 Claims, 6 Drawing Sheets

METHOD OF FORMING BURIED INTERCONNECTING WIRE

This application is a Continuation of application Ser. No. 08/745,343 filed Nov. 8, 1996 now U.S. Pat. No. 6,260,266, issued Jul. 17, 2001.

BACKGROUND OF THE INVENTION

The present invention relates to a method of forming a buried interconnecting wire by filling a recessed portion formed in an insulating film, such as a groove, with a metal for interconnections in the process of manufacturing a semiconductor integrated circuit device or the like. In particular, it relates to technology for preventing the metal for interconnections from being oxidized or diffused into the insulating film.

At present, an aluminum alloy is used predominantly as a metal for interconnections in a semiconductor integrated circuit device or the like. On the other hand, copper or a copper alloy is receiving attention as a promising replacement for the aluminum alloy to be used in the next generation because of its lower resistivity and higher immunity to electromigration.

The largest problems presented by copper interconnections composed of copper or a copper alloy are the oxidation of the copper interconnections, the diffusion of copper from the copper interconnections into an insulating film, and poor processibility of a copper film, which remain to be solved before the copper interconnections are used in practice. In particular, the copper or copper alloy composing the copper interconnections is easily oxidized by and diffused into a $SiO_2$ film used for an interlayer insulating film, which may adversely affect a device such as a transistor formed under the interlayer insulating film. To solve the problems, there has been proposed the formation of various barrier layers between the copper interconnections and the interlayer insulating film.

For example, Japanese Laid-Open Patent Publication HEI 02-240920 proposes a method of forming a barrier layer composed of a TiN film by performing $N_2$ annealing with respect to a Cu—Ti alloy at a temperature of 800° C. to prevent the oxidation and diffusion of copper.

On the other hand, Japanese Laid-Open Patent Publication HEI 06-275623 and "Diffusion Barrier Properties of Transition Metals and Their Nitrides for Cu Interconnections (T. Nakao et. al, VMIC (1994))" propose a method of forming a barrier layer composed of a tungsten nitride film by nitriding a W film by using a plasma in accordance with an ECR plasma method.

In the case of forming multi-layer metal interconnections by using the copper interconnections composed of copper or a copper alloy, the temperature of a heat treatment for a barrier layer should be 600° C. or lower to prevent the oxidation and diffusion of copper in the underlying copper interconnections. However, a TiN film as formed by $N_2$ annealing in accordance with the foregoing method cannot be implemented at a temperature of 600° C. or lower. If the TiN film is formed by $N_2$ annealing at a temperature of about 800° C., on the other hand, the copper in the underlying copper interconnections may be oxidized and diffused disadvantageously. What results is the problem that the use of the copper interconnections is incompatible with the formation of the barrier layer by $N_2$ annealing.

In the case of the latter method, the use of copper interconnections is compatible with the formation of the barrier layer by plasma nitriding, since the latter method allows the formation of a uniform barrier layer at a low temperature and hence is free from the problems of the oxidation and diffusion of the copper in the underlying copper interconnections. Unlike aluminum interconnections, it is extremely difficult to form copper interconnections from a copper film by performing dry etching with respect thereto, since a halogen compound is non-volatile.

To overcome the difficulty, there has been proposed a method of forming buried interconnections from copper by forming grooves in a region of an insulating film in which the interconnections are to be formed, depositing copper over the entire surface to form a copper film so that the copper is filled in the grooves, and removing portions of the copper film located outside the grooves.

In the case of forming the copper interconnections in accordance with such a method of forming buried interconnections, the barrier layer should be formed not only on the bottom of the grooves but also on the sidewalls thereof. In Japanese Laid-Open Patent Publication HEI 06-275623, as described above, the barrier layer composed of the metal nitride film is formed by depositing the metal on the bottom and sidewalls of the grooves to form the metal film and then plasma-nitriding the metal film under a pressure of 1 mTorr in accordance with the ECR plasma method.

Figure 6A:
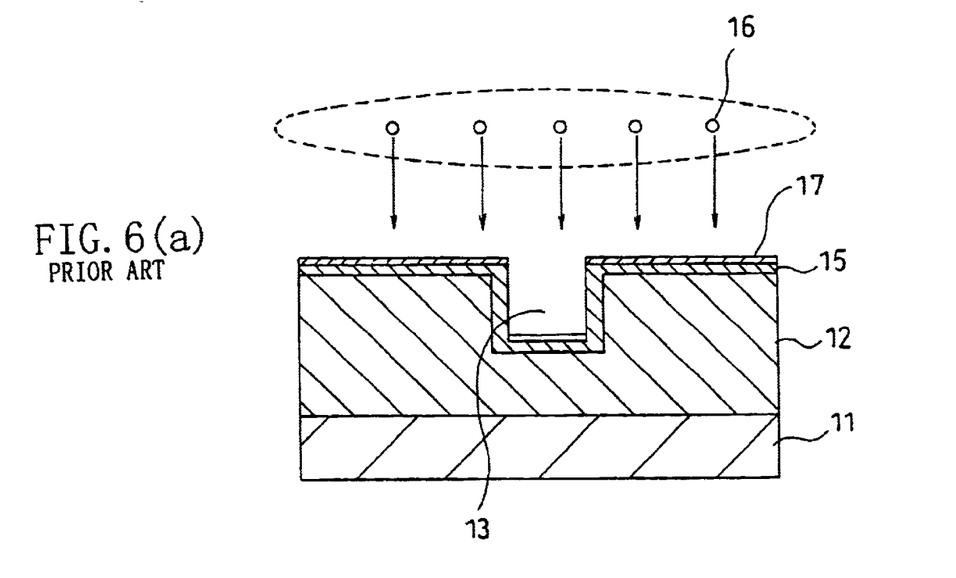
Figure 6B:
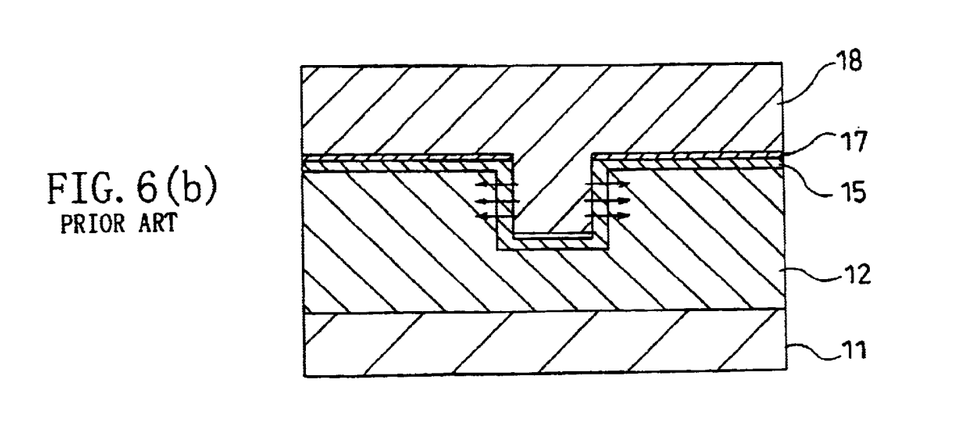

However, the conventional method of forming the barrier layer composed of a metal nitride film by performing a plasma-nitriding process at 1 mTorr has such problems as illustrated in FIGS. 6(a) and 6(b). FIG. 6(a) illustrates the process steps of depositing a silicon dioxide film 12 on a silicon substrate 11, forming a groove 13 in the silicon dioxide film 12, depositing a tungsten film 15 over the entire surface of the silicon dioxide film 12, and then forming a tungsten nitride film 17 on the surface of the tungsten film 15 by a plasma-nitriding method. In this case, the mean free path of nitrogen ions at 1 mTorr is 10 cm or more, which is much larger than the sheath length (about 3 mm) of a sheath region between a plasma generation region and the silicon substrate, so that the nitrogen ions have an extremely low probability of colliding with nitrogen molecules in the sheath region. Accordingly, nitrogen ions 16 are incident upon the silicon substrate 11 in a direction substantially perpendicular thereto, as shown in FIG. 6(a). As a result, the nitrogen ions 16 seldom reach these portions of the tungsten film 15 covering the sidewalls of the groove 13, where a nitriding reaction does not proceed, so that the tungsten nitride film 17 is not formed on the sidewalls of the groove 13.

If a copper film 18 is deposited over the entire surface of the substrate with the tungsten nitride film 17 being not formed on the portions of the tungsten film 15 covering the sidewalls of the groove 13, copper contained in the copper film 18 is diffused into the silicon dioxide film 12 through the portions of the tungsten film 15 covering the sidewalls of the groove 13 because of unsatisfactory barrier property of the tungsten film 15, which adversely affects a device formed on the silicon substrate 11.

Although the foregoing process of forming the metal film by depositing a high-melting-point metal on the bottom and sidewalls of the groove is preferably performed by CVD which provides excellent coverage over the bottom and sidewalls of the groove, the following problem arises during the process: If the crystal growth of the high-melting-point metal is promoted to deposit a metal film having a low resistivity, undulations are formed on the surface of the metal film so that the plasma-nitriding process proceeds on some portions of the metal film, while stagnating on others, due to the presence of the undulations. Hence, a barrier layer composed of an equally nitrided metal nitride film cannot be obtained.

SUMMARY OF THE INVENTION

In view of the foregoing, it is therefore an object of the present invention is to ensure, when a conductive film made of a high-melting-point conductive material and formed with a recessed portion is to be nitrided by using a plasma, that a nitride film of the high-melting-point conductive material is formed even on the sidewalls of the recessed portion of the conductive film.

The present invention has been achieved based on the finding that, when a plasma-nitriding process is performed with respect to the conductive film made of the high-melting-point conductive material under a pressure of 10 Pa or more, nitrogen ions reach even the sidewalls of the recessed portion of the conductive film, resulting in positive nitriding of the conducive film.

A method of forming a buried interconnecting wire according to the present invention comprises: a first step of forming a first recessed portion in an insulating film deposited on a semiconductor substrate; a second step of depositing a high-melting-point conductive material on the insulating film to form a first conductive film composed of the high-melting-point conductive material and having a second recessed portion in a position corresponding to the first recessed portion of the insulating film; a third step of nitriding a surface of the first conductive film by using a plasma with the semiconductor substrate being held in a vacuum chamber maintained at a pressure of 10 Pa or higher to form a second conductive film composed of a nitride of the high-melting-point conductive material and having a third recessed portion in a position corresponding to the second recessed portion of the first conductive film; a fourth step of depositing a metal for interconnections on the second conductive film such that the metal for interconnections is filled in the third recessed portion of the second conductive film to form a metal film composed of the metal for interconnections; and a fifth step of removing the portions of the first conductive film, the second conductive film, and the metal film located outside the first recessed portion of the insulating film to form a buried interconnecting wire made of the metal for interconnections in the third recessed portion of the second conductive film.

According to the method of forming a buried interconnecting wire of the present invention, the following phenomenon is observed.

Since the mean free path $\lambda_i$ is inversely proportional to the pressure P inside a vacuum chamber, the mean free path $\lambda_i$ is 10 cm or more when the pressure P is 1 mtorr. When the pressure P is 10 Pa (75 mTorr), the mean free path $\lambda_i$ of nitrogen ions becomes about 1 mm. Accordingly, a nitrogen ion passing through a sheath region having a sheath length $L_{sh}$ of several millimeters collides with gas molecules (nitrogen molecules) on the average of several times.

In practice, the sheath length $L_{sh}$ and the pressure P have a relationship represented by the following equation:

$$L_{sh}=bP^{-a} \ (a,b\text{:constants}, 0<a<0.5) \qquad (1).$$

Since the sheath length $L_{sh}$ becomes smaller as the pressure P becomes higher, the number of collisions in the sheath region is not simply inversely proportional to the pressure.

The sheath length $L_{sh}$ is substantially irrelevant to the pressure P in an anode-coupled plasma processing apparatus which does not generate a cathode drop voltage $V_{DC}$ in a semiconductor substrate and in a plasma processing apparatus which applies no negative bias, since the constant a is substantially zero in these apparatus. In the case of employing the plasma processing apparatus, if the pressure P is 10 Pa or higher, the nitrogen ion collides with gas molecules on the average of several times in the sheath region, so that a large number of nitrogen ions do not collide with the semiconductor substrate in a direction perpendicular thereto (i.e., collide with the semiconductor substrate obliquely). In this case, the nitrogen ions incident obliquely upon the semiconductor substrate collide not only with the bottom of the recessed portion but also the sidewalls thereof, thereby promoting the reaction wherein the first conductive film made of a high-melting-point conductive material and formed on the sidewalls of the recessed portion is nitrided.

When the average number of collisions is 3 or more, the probability is that a majority of nitrogen ions collide with gas molecules at least once before reaching the semiconductor substrate.

As a result, substantially all the nitrogen ions travelling in a vertical direction toward the sample stage have their travelling direction changed to be incident obliquely upon the semiconductor substrate, so that a part of the nitrogen ions entering the third recessed portion of the second conductive film surely reach the sidewalls of the third recessed portion. Consequently, a nitride film of the high-melting-point conductive material is positively formed on the sidewalls of the third recessed portion of the second conductive film, which prevents the metal for interconnections from being diffused into the insulating film when it is composed of a silicon dioxide film.

In the method of forming a buried interconnecting wire, the third step preferably includes the step of nitriding the surface of the first conductive film by using a plasma with the semiconductor substrate being held in a vacuum chamber maintained at a pressure of 50 Pa or higher.

What results is the occurrence of such a phenomenon that the probability of a nitrogen ion colliding with a gas molecule immediately before bumping onto the semiconductor substrate becomes extremely high, since the nitrogen ion collides with gas molecules on the average of ten times or more in the sheath region under the pressure being maintained at 50 Pa or higher inside the vacuum chamber. Although the nitrogen ion has been accelerated in a direction perpendicular to the semiconductor substrate in the sheath region, when the nitrogen ion having energy of certain magnitude in a direction perpendicular to the substrate collides with a gas molecule immediately before bumping onto the semiconductor substrate, the energy of the nitrogen ion in a direction parallel with the semiconductor substrate is increased. Accordingly, the number of nitrogen ions incident upon the semiconductor substrate at a shallow angle with respect thereto is increased so that the nitrogen ions are more likely to reach the sidewalls of the third recessed portion of the second conductive film, thereby nitriding the portions more positively.

In the method of forming a buried interconnecting wire, the metal for interconnections in the fourth step is preferably copper or a copper alloy. This prevents the metal for interconnections, which is copper or a copper alloy, from being diffused in to the insulating film.

In the method of forming a buried interconnecting wire, the high-melting-point conductive material in the second step is preferably titanium, tantalum, or tungsten. This enables the formation of the barrier layer made of a nitride of titanium, tantalum, or tungsten.

In the method of forming a buried interconnecting wire, the third step preferably includes the step of nitriding the surface of the first conductive film by using a plasma with the semiconductor substrate being held at the ground potential or at a positive potential.

What results is the occurrence of such a phenomenon that nitrogen ions are accelerated at a potential equal to or higher than the plasma potential in a cathode-coupled plasma processing apparatus which generates a cathode drop voltage $V_{DC}$ in the semiconductor substrate or in a plasma processing apparatus which applies a negative bias to the substrate. In the plasma-nitriding process, the range of angles at which the nitrogen ions are scattered upon colliding with nitrogen molecules (scattering angle) is dependent on the energy of the ions, so that the ions are scattered in a wider range of angles as the energy of the ions is smaller. In the foregoing plasma processing apparatus wherein the nitride ions are accelerated at a potential equal to or higher than the plasma potential, therefore, it is difficult for the nitrogen ions to be incident upon the semiconductor substrate at such a small angle as to nitride the sidewalls of the second recessed portion of the first conductive film even after colliding with gas molecules. However, since the plasma-nitriding process is performed with the semiconductor substrate being held at the ground potential or at a positive potential, the nitrogen ions are accelerated only at the plasma potential, which widens the range of scattering angles of the nitrogen ions. As a result, the nitrogen ions are incident upon the semiconductor substrate at a small angle thereto, resulting in more equal formation of the second conductive film made of the nitride of the high-melting-point conductive material.

In the method of forming a buried interconnecting wire, the second step preferably includes the step of depositing the high-melting-point conductive material by CVD. This enables the formation of the first conductive film providing excellent coverage over the bottom and sidewalls of the first recessed portion of the insulating film.

When the second step is performed by CVD, the second step preferably includes the step of depositing the high-melting-point conductive material at a temperature within such a range as to suppress crystallization of the high-melting-point conductive material to form the first conductive film with at least a part thereof being amorphous.

As a result, the first conductive film is formed from the high-melting-point conductive material with at least a part thereof being amorphous, so that undulations are less likely to be formed on the surface of the first conductive film. In forming the second conductive film by plasma-nitriding the surface of the first conductive film, therefore, the nitriding process proceeds at a substantially constant rate over the surface of the first conductive film. This enables more equal formation of the second conductive film made of the nitride of the high-melting-point conductive material.

BRIEF DESCRIPTION OF THE DRAWINGS

FIGS. 1(*a*) to 1(*c*) are cross-sectional views illustrating the individual steps of a method of forming a buried interconnecting wire in an embodiment of the present invention;

FIGS. 2(*a*) and 2(*b*) are cross-sectional views illustrating the individual steps of the method of forming a buried interconnecting wire in the embodiment of the present invention;

FIGS. 6(*a*) and 6(*b*) are cross-sectional views for illustrating problems associated with a conventional method of forming a buried interconnecting wire.

DETAILED DESCRIPTION OF THE PRESENT INVENTION

Figure 1A:
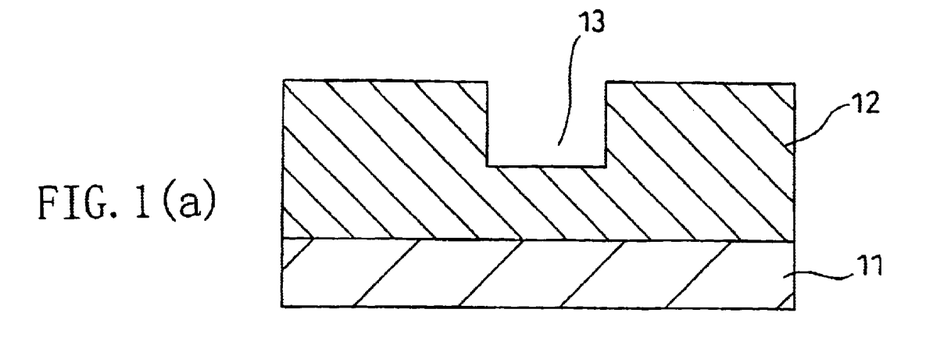
Figure 1B:
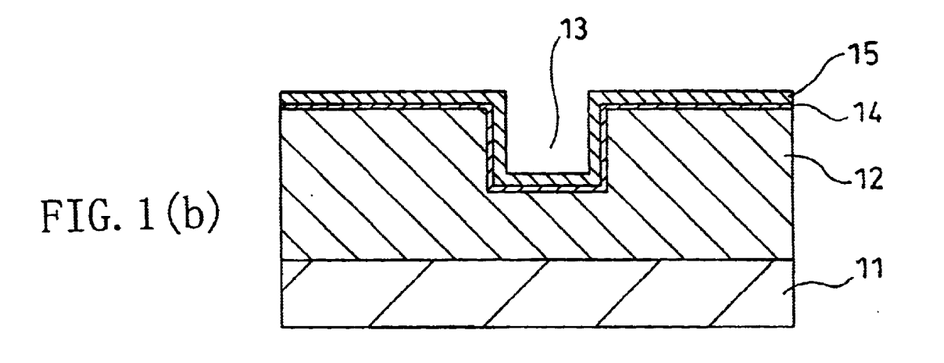
Figure 1C:
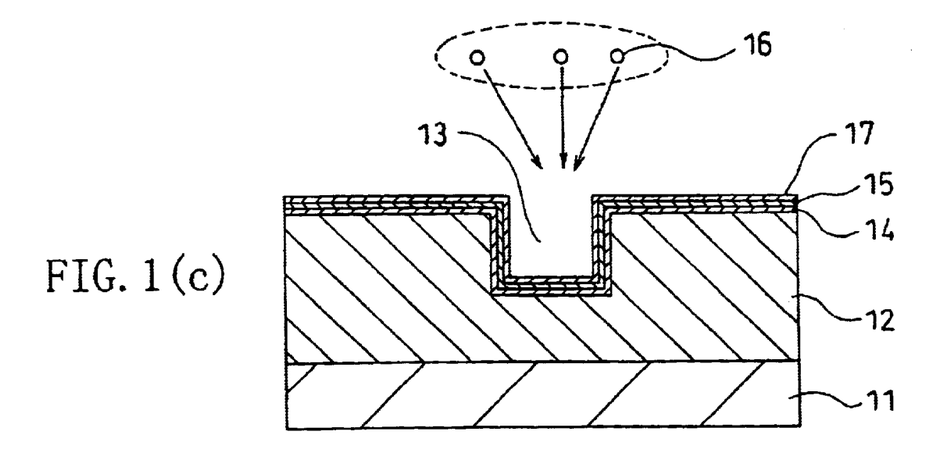
Figure 2A:
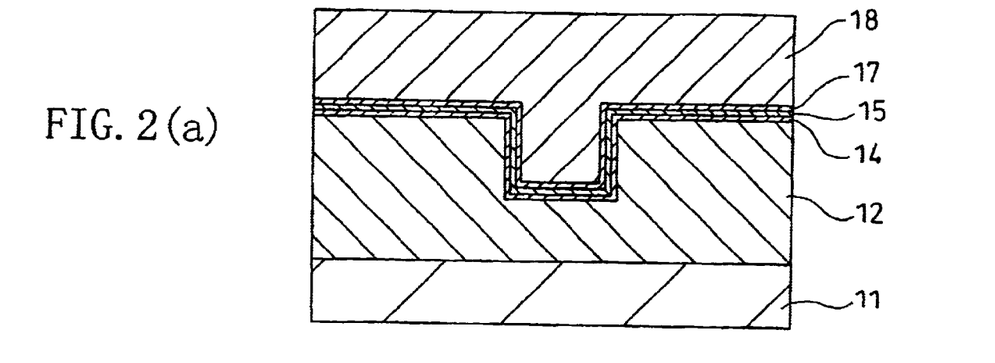
Figure 2B:
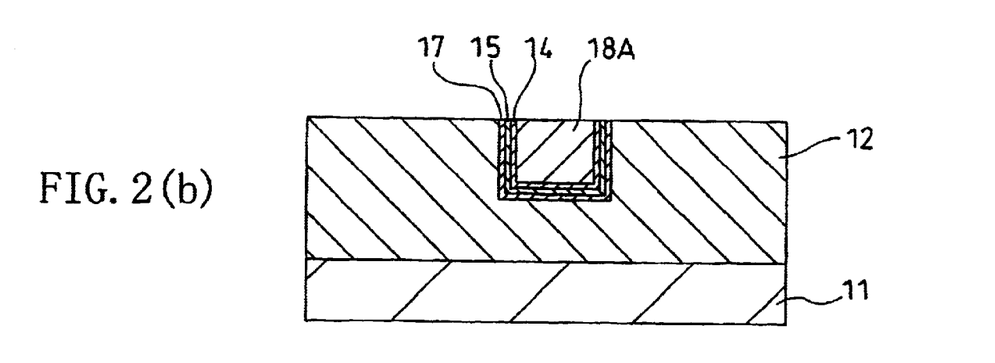
Figure 3:
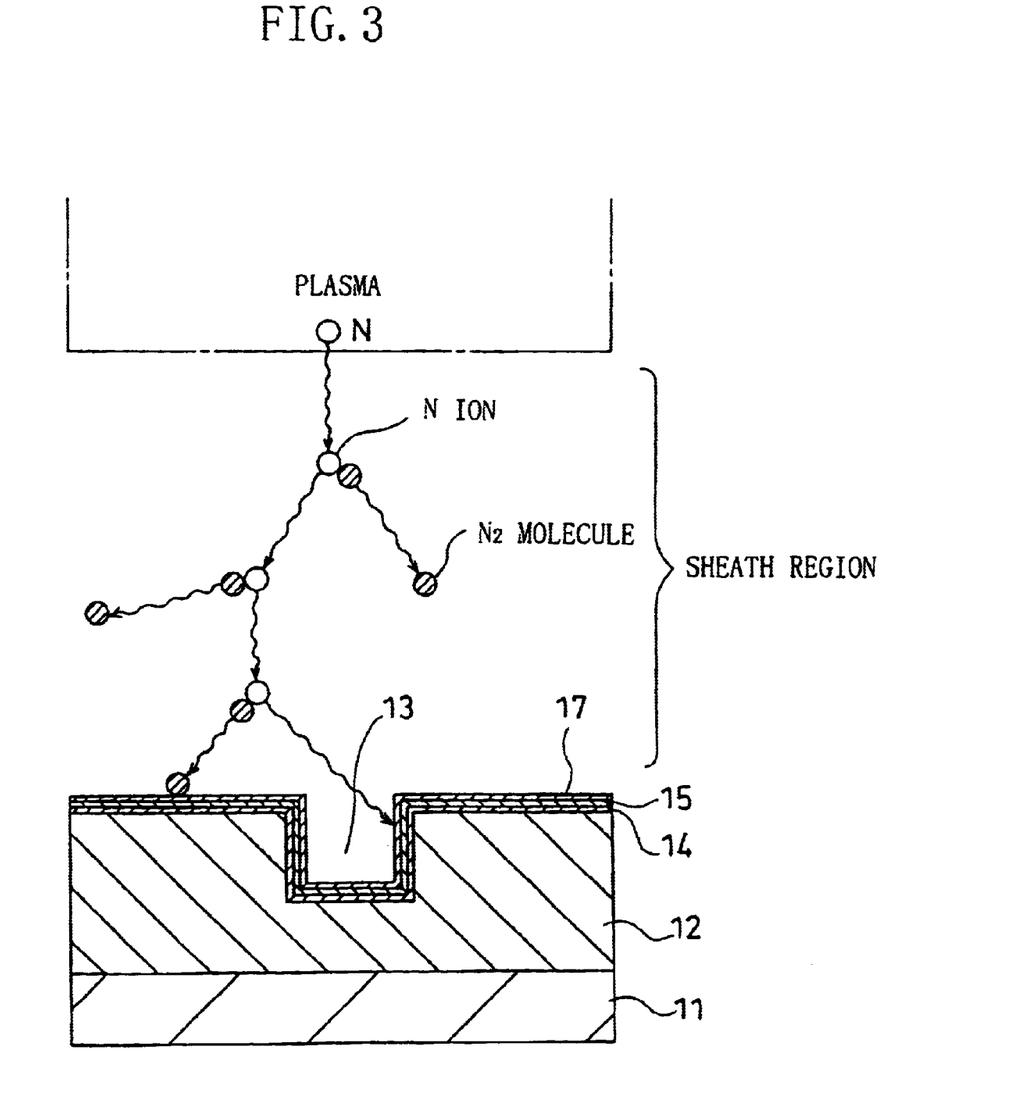
FIG. 3 is a conceptual view showing collisions between nitrogen ions and nitrogen molecules during a plasma-nitriding process in accordance with the method of forming a buried interconnecting wire in the embodiment of the present invention.

FIGS. 1 and 2 are cross-sectional views sequentially illustrating the individual steps of a method of forming a buried interconnecting wire in an embodiment of the present invention.

Initially, as shown in FIG. 1(*a*), a silicon dioxide film 12 having a thickness of 1.5 μm is deposited as an insulating film on a silicon substrate 11 by plasma CVD, followed by the formation of a groove 13 having a depth of 600 nm in the silicon dioxide film 12 in accordance with a wiring pattern.

Next, as shown in FIG. 1(*b*), a titanium film 14 having a thickness of 30 nm is deposited as an adhesion layer on the silicon dioxide film 12 by sputtering. Subsequently, a tungsten film 15 having a thickness of 50 nm is deposited as a first conductive film made of a high-melting-point conductive material on the titanium film 14 by thermal CVD using a $WF_6$ gas. A typical processing temperature for the formation of the tungsten film by thermal CVD is about 450° C. at which crystal growth proceeds satisfactorily and a film with a low resistivity can be deposited. If the crystal growth proceeds satisfactorily, however, undulations of several tens of nanometers are formed on the surface of the tungsten film 15 so that these portions of the tungsten film 15 covering the sidewalls of the groove 12 and underlying the projecting portions thereof are shadowed. In the regions of the tungsten film 15 covering the sidewalls of the groove 12 and shadowed by the projecting portions, the process of nitriding the tungsten film 15 proceeds only insufficiently during a plasma processing process which will be described later, so that the thermal CVD is preferably performed at a temperature of about 350° C. in order to suppress the crystal growth, thereby depositing the tungsten film 15 with a smooth surface.

Figure 4:
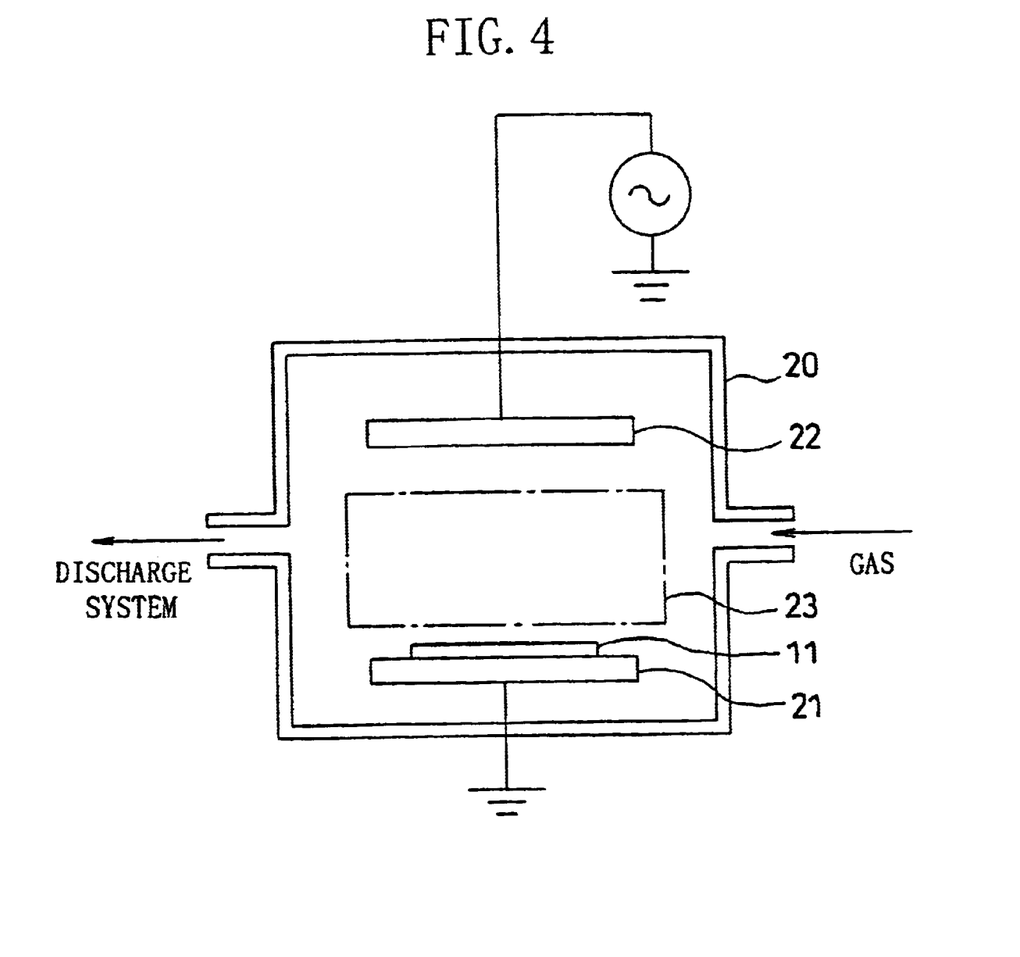
FIG. 4 is a schematic view showing the structure of an anode-coupled plasma processing apparatus for use in the method of forming a buried interconnecting wire in the embodiment of the present invention.

Next, as shown in FIG. 1(*c*), nitrogen ions 16 are caused to reach the surface of the tungsten film 15 to form a tungsten nitride film 17 as a second conductive film, which functions as a barrier layer for copper, by using an anode-coupled plasma processing apparatus. In FIG. 4 are shown: a vacuum chamber 20; and a sample stage 21 disposed in the vacuum chamber 20 as an anode electrode for holding the silicon substrate 11, which has been grounded. In FIG. 4 is also shown an opposing electrode 22 provided as a cathode electrode to face the sample stage 21. To the opposing electrode 22, rf power is applied to generate a plasma in a plasma region 23 between the sample stage 21 and the opposing electrode 22. When the tungsten nitride film 17 is formed by using such an anode-coupled plasma processing apparatus, a cathode drop voltage is not generated in the silicon substrate 11 so that the constant a becomes substantially zero in the foregoing equation (1). Therefore, the sheath length $L_{sh}$ becomes irrelevant to the pressure P.

Below, a description will be given to processing conditions for forming the tungsten nitride film 17 on the surface of the tungsten film 15.

Following is an example of the processing conditions on which the nitrogen ions 16 are obliquely incident upon the silicon substrate 11:

| Gas: | $N_2$ |
|---|---|
| Gas Flow Rate: | 100 sccm |
| Pressure: | 10 Pa (75 mTorr) |
| RF Power: | 500 W |
| Temperature of Sample Stage: | 25° C. |
| Processing Time: | 60 sec |

When the pressure inside the vacuum chamber 20 is 10 Pa, the mean free path of the nitrogen ions 16 is about 1 mm, so that the nitrogen region 16 passing through the sheath region having a sheath length of about 3 mm collide with nitrogen molecules on the average of three times. If the average number of collisions of a nitrogen ion 16 with nitrogen molecules is three or more, it follows that substantially all the nitrogen ions 16 collide with nitrogen molecules at least once before reaching the silicon substrate 11. Thus, the nitrogen ions 16 surely collide with nitrogen molecules in the sheath region when the pressure inside the vacuum chamber 20 is adjusted to be 10 Pa or higher. Consequently, substantially all the nitrogen ions 16 are obliquely incident upon the silicon substrate 11 to reach not only the bottom of the groove 13 but also the sidewalls thereof, so that the nitriding reaction proceeds on the portions of the tungsten film 15 covering the sidewalls of the groove 13 as well.

Since the nitrogen ion 16 is accelerated in the sheath region, energy thereof in a direction perpendicular to the silicon substrate 11 has been increased immediately before reaching the silicon substrate 11. Accordingly, it is preferred for the nitrogen ion 16 to collide with a nitrogen molecule immediately before it reaches the silicon substrate 11. To achieve this, the average number of collisions of a nitrogen ion 16 with nitrogen molecules in the sheath region is preferably 10 or more. The processing pressure obtained in that case is 50 Pa (375 mTorr) or higher.

If the processing pressure is adjusted to be 100 Pa or higher, the number of nitrogen ions 16 incident upon the silicon substrate 11 at a small angle with respect thereto drastically increases. The adjustment is particularly effective, since it allows equal formation of the tungsten nitride film 17 over the entire surface of the silicon substrate 11 including the sidewalls of the groove 13.

Since the present embodiment has used the anode-coupled plasma processing apparatus whereby the energy of the ion is not excessively increased, the scattering angle of the nitrogen ion 16 becomes large so that the nitrogen ion 16 is incident upon the silicon substrate 11 more obliquely (i.e., at a smaller angle with respect thereto).

Since the plasma-nitriding process employs the processing apparatus and conditions described above, the tungsten film 15 with a smooth surface is deposited by thermal CVD at a low temperature of about 350° C. and the nitrogen ions 16 are incident obliquely upon the silicon substrate 11 and surely collide with the portions of the tungsten film 15 covering the sidewalls of the groove 13, which ensures positive and equal formation of the tungsten nitride film 17 on the sidewalls of the groove 13.

Although the present embodiment has used the pressure of 10 Pa in forming the tungsten nitride film 17, if the pressure is adjusted to be about 50 Pa or 100 Pa, the number of nitrogen ions 16 incident upon the silicon substrate 11 at a small angle with respect thereto is increased so that the tungsten nitride film 17 is formed more equally on the sidewalls of the groove 13.

Although the present embodiment has used the anode-coupled plasma processing apparatus to plasma-nitride the tungsten film 15 as described above, similar effects can be achieved by using an ICP (inductively-coupled plasma) processing apparatus with no bias applied or a micro-wave plasma generating apparatus instead. Preferably, the use of the cathode-coupled plasma processing apparatus which generates a cathode drop voltage $V_{DC}$ in the silicon substrate 11 or the plasma processing apparatus which applies no negative bias to the silicon substrate 11 is avoided, since each of the foregoing apparatus increases the energy of the nitrogen ion 16 in a direction perpendicular to the silicon substrate 11 due to the dependence of the scattering angle on the energy of the ion. The ions are preferably accelerated only at the plasma potential by grounding the sample stage 21 or like procedure.

Next, as shown in FIG. 2(a), the copper film 18 as a metal film is deposited over the entire surface to a thickness of about 800 nm by sputtering. The copper film 18 is then subjected to a heat treatment at 400° C. in a hydrogen atmosphere so that the molten copper film 18 is poured into the groove 13.

Next, as shown in FIG. 2(b), the portions of the titanium film 14, tungsten film 15, tungsten nitride film 17, and copper film 18 located outside the groove 13 are removed. Thereafter, an interlayer insulating film including a silicon nitride film or the like is deposited by a known method, followed by the formation of an interconnecting layer on the interlayer insulating film, resulting in multilayer interconnections.

Figure 5:
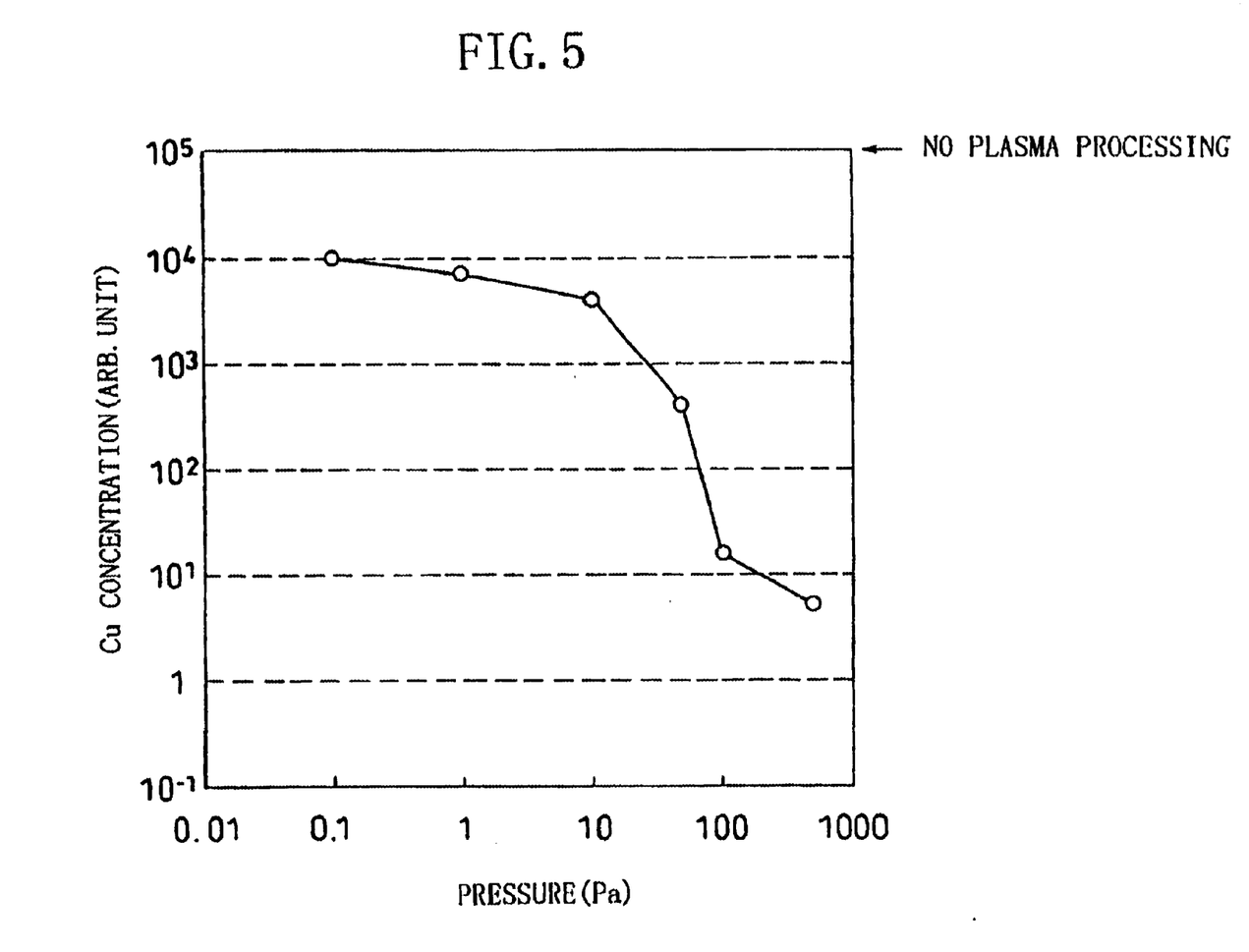
FIG. 5 is a characteristic view showing a relationship between a processing pressure P and the concentration of copper diffused in a tungsten film during the plasma-nitriding process in accordance with the method of forming a buried interconnecting wire in the embodiment of the present invention.

FIG. 5 shows a relationship between the processing pressure P and the concentration of copper diffused in the tungsten film during the plasma-nitriding process. As can be understood from the drawing, the concentration of copper is remarkably reduced when the processing pressure becomes 10 Pa or higher, which confirms the formation of the tungsten nitride film 17 on the portions of the tungsten film 15 covering the bottom and sidewalls of the groove 13. It can also be understood from FIG. 5 that, when the pressing pressure becomes 100 Pa or higher, the amount of diffused copper can be reduced by four orders of magnitude and the tungsten nitride film 17 is formed more positively on the portions of the tungsten film 15 covering the bottom and sidewalls of the groove 13.

As described above, since the present embodiment has used the foregoing processing apparatus and conditions in the plasma-nitriding process, the nitrogen ions 16 are incident upon the silicon substrate 11 surely obliquely to efficiently reach the portions of the tungsten film 15 covering the sidewalls of the groove 13, thereby enabling positive formation of the tungsten nitride film 17 on the sidewalls. This prevents the copper contained in the copper film 18 from being diffused into the silicon dioxide film 12 and enables the formation of a buried copper interconnecting wire which has low wiring resistance and hence does not adversely affect a device such as a transistor.

Although the present embodiment has used tungsten as the high-melting-point conductive material and plasma-nitrided the tungsten film 15 to form the tungsten nitride film 17 as the barrier layer, other high-melting-point metal films including a titanium film and a tantalum film may be used instead of the tungsten film 15. The barrier layer may also be composed of a titanium nitride film or tantalum nitride film formed by plasma-nitriding the titanium film or tantalum film. It is also possible to use titanium nitride as the high-melting-point conductive material to form a barrier layer of improved barrier property by plasma-nitriding the high-melting-point conductive film composed of titanium nitride or the like, instead of the tungsten nitride film 17.

Although the present embodiment has deposited the titanium film 14 as the adhesion layer on the silicon dioxide film 12 to enhance the adhesion of the tungsten film 15 to the silicon dioxide film 12, the formation of the adhesion layer may be omitted when the titanium nitride film is formed as the barrier layer.

Although the present embodiment has used copper as the metal for interconnections, a copper alloy, gold, or silver may be used instead of copper.

I claim:

1. A method of forming an interconnect, comprising the steps of:

forming a first recessed portion in an insulating film deposited on a semiconductor substrate;

forming a first conductive film on each of a bottom face and side faces of said first recessed portion by chemical vapor deposition, said first conductive film comprising a conductive material and having a second recessed portion in a position corresponding to said first recessed portion of said insulating film;

forming a second conductive film in an upper portion of each of a bottom face and side faces of said second recessed portion of said first conductive film by performing plasma nitriding on a surface of said first conductive film with said semiconductor substrate being held in a vacuum chamber maintained at a pressure of 10 Pa or higher, said second conductive film comprising a nitride of said conductive material and having a third recessed portion in a position corresponding to said second recessed portion of said first conductive film;

forming a metal film by depositing a metal on said second conductive film and said insulating film such that said metal is filled in said third recessed portion of said second conductive film, said metal film comprising said metal; and forming an interconnect formed of said metal in said third recessed portion of said second conductive film.

2. The method of forming an interconnect according to claim 1, wherein the pressure within said vacuum chamber in which said semiconductor substrate is held during the plasma nitriding in the step of forming said second conductive film is maintained at a 50 Pa or higher.

3. The method of forming an interconnect according to claim 1, wherein said metal is copper or a copper alloy.

4. The method of forming an interconnect according to claim 1, wherein said conductive material is titanium, tantalum or tungsten.

5. The method of forming an interconnect according to claim 1, wherein the plasma nitriding in the step of forming said second conductive film is performed with said semiconductor substrate being held at the ground potential or at a positive potential.

6. The method of forming an interconnect according to claim 1, wherein the chemical vapor deposition in the step of forming said first conductive film is performed at a temperature within such a range as to suppress crystallization of said conductive material and make at least a part thereof amorphous.

7. The method of forming an interconnect according to claim 1, wherein said metal film is deposited directly on said second conductive film.

8. The method of forming an interconnect according to claim 1, wherein the step of forming an interconnect formed of said metal in said third recessed portion of said second conductive film includes removing a portion of said metal film which is located above said insulating film.

9. A method of forming an interconnect, comprising the steps of:

forming a first recessed portion in an insulating film deposited on a semiconductor substrate;

forming a first conductive film on each of a bottom face and side faces of said first recessed portion, said first conductive film comprising a conductive material and having a second recessed portion in a position corresponding to said first recessed portion of said insulating film; and forming a second conductive film in an upper portion of each of a bottom face and side faces of said second recessed portion of said first conductive film by performing plasma nitriding on a surface of said first conductive film with said semiconductor substrate being held in a vacuum chamber maintained at a pressure of 10 Pa or higher, said second conductive film comprising a nitride of said conductive material and having a third recessed portion in a position corresponding to said second recessed portion of said first conductive film.

10. The method of forming an interconnect according to claim 9, further including the steps of:

forming a metal film by depositing a metal on said second conductive film and said insulating film such that said metal is filled in said third recessed portion of said second conductive film, said metal film comprising said metal; and forming an interconnect formed of said metal in said third recessed portion of said second conductive film by removing a portion of said metal film which is located above said insulating film.

11. The method of forming an interconnect according to claim 10, wherein said metal film is deposited directly on said second conductive film.

12. The method of forming an interconnect according to claim 9, further including the step of:

forming a metal film by depositing a metal on said second conductive film and said insulating film such that said metal is filled in said third recessed portion of said second conductive film, said metal film comprising said metal, wherein said metal is copper or a copper alloy.

13. The method of forming an interconnect according to claim 9, wherein said first conductive film is formed by chemical vapor deposition at a temperature within such a range as to suppress crystallization of said conductive material and make at least a part thereof amorphous.

14. The method of forming an interconnect according to claim 9, further including a step of forming an adhesion layer on said insulating film before the step of forming a first conductive film.

* * * * *